United States Patent [19]

Maeda et al.

[11] Patent Number: 5,780,870
[45] Date of Patent: Jul. 14, 1998

[54] SEMICONDUCTOR DEVICE AND A PROCESS OF MANUFACTURING THE SAME

[75] Inventors: Hitoshi Maeda; Yukinori Hirose; Yuichi Yokoyama, all of Tokyo, Japan

[73] Assignee: Mitsubishi Denki Kabushiki Kaisha, Tokyo, Japan

[21] Appl. No.: 723,366

[22] Filed: Sep. 30, 1996

[30] Foreign Application Priority Data

Mar. 28, 1996 [JP] Japan .................................. 8-073568

[51] Int. Cl.⁶ .......................... H01L 23/48; H01L 29/04
[52] U.S. Cl. ........................ 257/48; 257/296; 257/754
[58] Field of Search ........................... 257/754, 296, 257/48

[56] References Cited

U.S. PATENT DOCUMENTS

| | | | |
|---|---|---|---|
| 5,321,296 | 6/1994 | Shouno | 257/412 |
| 5,466,971 | 11/1995 | Higuchi | 257/751 |
| 5,495,439 | 2/1996 | Morihara | 365/149 |

FOREIGN PATENT DOCUMENTS

| | | | |
|---|---|---|---|
| 1-68932 | 2/1989 | Japan | 25/412 |
| 4-137644 | 7/1992 | Japan | 257/412 |

OTHER PUBLICATIONS

*Chemical Abstracts*, No. 1-68932.
*Chemical Abstracts*, No. 4-137644.

Primary Examiner—Donald Monin
Attorney, Agent, or Firm—Oblon, Spivak, McClelland, Maier & Neustadt, P.C.

[57] ABSTRACT

A semiconductor device is provided for convenient checking of etching states of semiconductor layers, along with a process for its preparation, wherein a test layer is formed on the same wafer where a semiconductor product is manufactured, and concurrently with and under the same formation conditions as formation a target layer forming a part of the semiconductor product, wherein the test layer is formed on a first layer and on a second layer interposed between a portion of the test layer and the first layer, with one of the first and second layers having the same etching properties as the target layer and the other of the first and second layers having different etching characteristics from the target layer. After etching the test layer and target layer concurrently to form holes in each the amount of the etching of the holes can be measured by an electron microscope, and the amount of etching in the target layer of the semiconductor product is controlled from the state of the etching reaching to the lower layer, either the first or second layer, below the test layer.

15 Claims, 2 Drawing Sheets

SEMICONDUCTOR DEVICE AND A PROCESS OF MANUFACTURING THE SAME

BACKGROUND OF THE INVENTION

1. Field of the Invention

The present invention relates to a semiconductor device and a process of manufacturing the same applied for confirming the etching state in a semiconductor product.

2. Description of the Background Art

In the conventional method of manufacturing a semiconductor device such as a LSI, either surface SEM observation of a wafer in a process or section observation of a wafer after sampling from a process line is conducted for confirming the etching state in a semiconductor product.

Confirmation of the etching state is performed to check whether the etching reached the layer which is required to be exposed. For instance, an opening becomes defective if the contact hole does not reach the layer which is required to be exposed in the formation of a contact hole between multi-layer conductors (i.e. under etching). Further, if etching is not completed when electric leads are patterned, the leads become short circuited.

In such etching confirmation processes, surface SEM observation is difficult in judging the etching state in wafer process. In the case of the section observation process, the etched wafer must be sampled from the process line and sliced. Therefore, extra wafer samples are needed for confirmation of the etching state.

SUMMARY OF THE INVENTION

Accordingly, the object of the present invention is to solve the aforementioned problems.

According to one embodiment of the present invention, a semiconductor device is provided comprising a test layer formed on a first layer and a second layer, which are, in turn, formed on a wafer where a semiconductor product is manufactured. The first layer has the same etching characteristics as a target layer in the semiconductor product, and the second layer has different etching characteristics from the target layer in the semiconductor product. The test layer has holes formed by etching respectively on the first and second layer, which are formed in the same condition and concurrently with a hole formed by etching in the target layer in the semiconductor product. With this construction, the etched state of the target layer of the semiconductor product is confirmed by comparing the etched states of the holes in the test layer on the first and second layers.

In another embodiment of the present invention, in the semiconductor device, the target layer and the test layer are each a silicon oxide layer respectively, while the first layer is a silicon oxide layer, and the second layer is a semiconductor substrate layer.

In another embodiment of the present invention, the hole formed in the target layer is a contact hole in the semiconductor product.

According to another embodiment of the present invention, a process of manufacturing a semiconductor device is provided in which a test layer is formed respectively on the first and second layers, which are formed in turn on a wafer where a semiconductor product is manufactured. The first layer has the same etching characteristics as a target layer in the semiconductor product, and the second layer has different etching characteristics from the target layer in the semiconductor product. Then, a resist layer is formed on the test layer concurrently with the forming of a resist layer on the target layer in the semiconductor product. Then, holes are formed in the resist layer, respectively on the first and second layer concurrently with the formation of a hole in the resist layer on the target layer in the semiconductor product. Further, holes are formed in the test layer by etching through the holes in the resist layer, respectively on the first and second layer, under the same conditions and concurrently with formation of a hole in the target layer in the semiconductor product by etching through the hole in the resist layer.

Thus, additional etching of the hole in the target layer of the semiconductor product is adjusted by comparing the etched states of the holes in the test layer on the first and second layers.

In another embodiment of the present invention, a process of manufacturing a semiconductor device is provided in which the target layer and the test layer are each silicon oxide layers, while the first layer is a silicon oxide layer, and the second layer is a semiconductor substrate layer.

In another embodiment of the present invention, a process of manufacturing a semiconductor device is provided in which the hole formed in the target layer is a contact hole in the semiconductor product.

Further, according to another embodiment of the present invention, a semiconductor device is provided comprising portions of a test layer remaining after etching and formed on a first layer and a second layer, which are in turn formed on a wafer where a semiconductor product is manufactured. The first layer has the same etching characteristics as a target layer in the semiconductor product, and the second layer has different etching characteristics from the target layer in the semiconductor product. The portions of the test layer remaining after etching are formed by etching respectively on the first and second layer, under the same conditions and concurrently with a portion of the target layer remaining after etching in the target layer in the semiconductor product. With this construction, the etched state of the portion in the target layer remaining after etching is confirmed by comparing the etched states of the remaining portions of the test layer on the first and second layers.

In another embodiment of the present invention, the target layer and the test layer are polysilicon layers, while the first layer is a semiconductor substrate layer, and the second layer is a silicon oxide layer.

In another embodiment of the present invention, the portion of the target layer of the semiconductor product remaining after etching is a gate electrode.

Still further, according to another embodiment of the present invention, a process of manufacturing a semiconductor device is provided in which a test layer is formed respectively on a first layer and a second layer, which are formed in turn on a wafer where a semiconductor product is manufactured. The first layer has the same etching characteristics as a target layer in the semiconductor product, and the second layer has different etching characteristics from the target layer in the semiconductor product. Then, a patterned resist layer is formed on the test layer concurrently with the forming of a patterned resist layer on the target layer in the semiconductor product. Then, remaining portions of the test layer are formed by etching with the patterned resist layer respectively on the first and second layers, under the same conditions and concurrently with forming of a remaining portion of the target layer by etching with the patterned resist layer. Thus, additional etching of the remaining portion of the target layer of the semiconductor product is adjusted by comparing the etched states of the remaining portions of the test layer on the first and second layers.

In another embodiment of the present invention, a process of manufacturing a semiconductor device is provided in which the target layer and the test layer are polysilicon layers, while the first layer is a semiconductor substrate layer, and the second layer is a silicon oxide layer.

In another embodiment of the present invention, a process of manufacturing a semiconductor device is provided in which the hole formed in the target layer is a gate electrode.

In another embodiment of the present invention, a process of manufacturing a semiconductor device is provided in which an electron microscope is used for comparing the etched states in the test layer on the first and second layers.

Other features and advantages of the invention will be apparent from the following description taken in connection with the accompanying drawings.

DETAILED DESCRIPTION OF THE PREFERRED EMBODIMENTS

The present invention will be described in further detail by way of example with reference to the accompanying drawings.

First Embodiment

Figure 1:
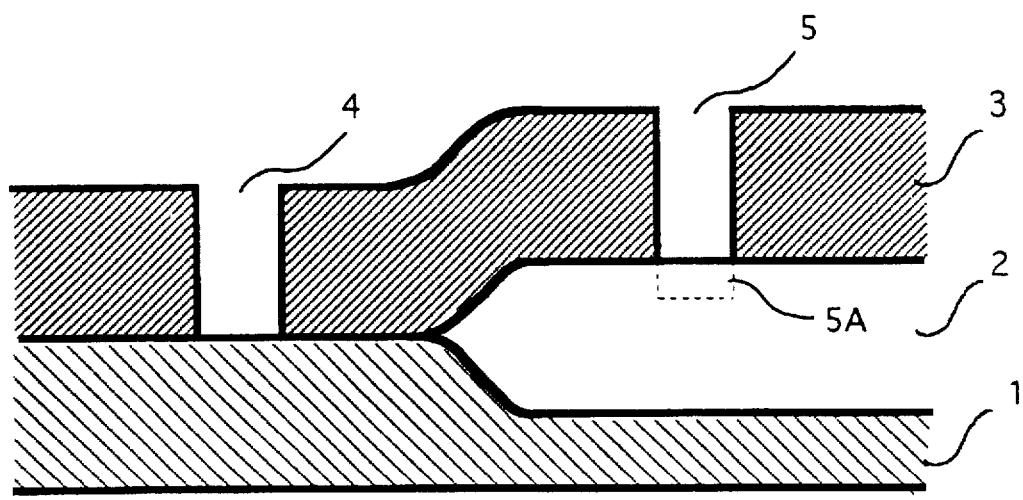
FIG. 1 illustrates a cross sectional view of a structure of the semiconductor device according to a first embodiment of the present invention.

A first embodiment of the present invention is explained with reference to FIG. 1. FIG. 1 shows a cross sectional structure of the semiconductor device which is used for the confirmation of the etching state through the process of opening a hole in a Si oxide layer on a Si substrate in manufacturing a product LSI.

Referring to FIG. 1, the device includes a Si substrate 1 of the wafer, a Si oxide layer 2 formed partly on the Si substrate 1, and a Si oxide layer 3 (the material for etching) formed on Si substrate 1 and on Si oxide layer 2. The Si oxide layer 3 is deposited under the same conditions as the formation of a Si oxide layer in a product LSI. A hole 4 is formed in Si oxide layer 3 on Si substrate 1 by etching under the same conditions as the product LSI, and a hole 5 is formed in the Si oxide layer 3 on the Si oxide layer 2 by etching under the same conditions as the product LSI.

The structure of the semiconductor device shown in FIG. 1 is constructed on a part of the area or near the area of the same wafer where the product LSI is manufactured, and is manufactured simultaneously with the product LSI. In the manufacturing process of the product LSI in this case, the field oxidation process (film thickness 3000 Å) by the LOCOS method is preferably used. Further, a Si oxide layer of 3000 Å thick is deposited as an interlayer insulating film by CVD method, and thereafter, a contact hole, preferably of 1 μm in diameter, for example, is formed in the interlayer insulating film on the Si substrate by an anisotropic etching of Si oxide. The anisotropic etching of Si oxide is performed, preferably using $CF_4+H_2$ or $CHF_3+O_2$ etc. as an etching gas, by reactive ion etching with a slow Si etching rate.

The manufacturing method of the structure of the semiconductor device shown in FIG. 1 is explained below referring to the figure. First, Si oxide layer 2 is formed, concurrently with the field oxidation process of the product LSI, on an area of Si substrate 1 other than the area where the product LSI is manufactured. Next, Si oxide layer 3 is deposited on Si substrate 1 and Si oxide layer 2. Layer 3 is deposited concurrently with the depositing of the interlayer insulting film of the product LSI. Next, a hole 4 is formed in Si oxide layer 3 on Si substrate 1 concurrently with the formation of a contact hole in the product LSI by etching under the same conditions as in the product LSI. At the same time, a hole 5 is formed in Si oxide layer 3 on Si oxide layer 2 by etching also under the same conditions as the product LSI. These holes 4 and 5 are formed with the same open caliber as the contact hole in the product LSI, for instance, 1 μm in the diameter.

Next, the method of confirming the etching state using an electron microscope is explained with regard to the structure of the semiconductor device shown in FIG. 1. The surface area of hole 4, formed in Si oxide layer 3 on Si substrate 1, and the surface of the area of hole 5, formed in Si oxide layer 3 on Si oxide layer 2, are scanned with an electron microscope after the contact hole of the product LSI is formed.

In FIG. 1, when hole 4 and hole 5 are formed concurrently by etching on Si oxide layer 3, the etching of Si oxide layer 3 advances at the same speed. When the etching reaches the depth of Si oxide layer 3, the etching hardly advances in hole 4 because the lower layer is Si substrate 1. On the other hand, the etching advances in Si oxide film 2 continuously at a similar speed as in hole 5, because the lower layer is Si oxide layer 2, and the etching reaches the depth of hole 5A shown in the figure.

Then, the amount of etching of hole 4 and hole 5 (i.e. the depth of the etching, assumed to be 'a' and 'b' respectively) is measured by scanning the surface of the area of the structure shown in FIG. 1 with an electron microscope. Then the amount 'a' and 'b' are compared. If 'a'<'b', that is, if the amount of etching of hole 5 is larger than the amount of etching of hole 4, then the etching penetrates through Si oxide 3 in hole 5. Therefore, it can be readily determined that the etching surely reached to Si substrate 1 also in hole 4. Accordingly, the contact hole is surely reaching the Si substrate in the product LSI (i.e. over etching).

Further, if 'a'='b', that is, if the amount of etching of hole 4 is equal to the amount of etching of hole 5, then the state is that hole 5 just reaches Si oxide layer 2 or that hole 5 has not yet reached Si oxide layer 2. Therefore, it can be concluded that the same situation is present in hole 4 also. Accordingly, it is determined that the product LSI is in the state that the contact hole just reaches the Si substrate (i.e. just etching) or the contact hole does not yet reach the Si substrate (i.e. under etching) in the LSI product.

Further, it is also possible to measure at this time the open caliber of hole 4 and consequently the open caliber of the contact hole of the product LSI. The caliber measurement is also performed using an electron microscope. Accordingly, the product LSI can be manufactured without using an extra wafer for confirming the state of the etching in the processing of the wafer.

Second Embodiment

Figure 2:
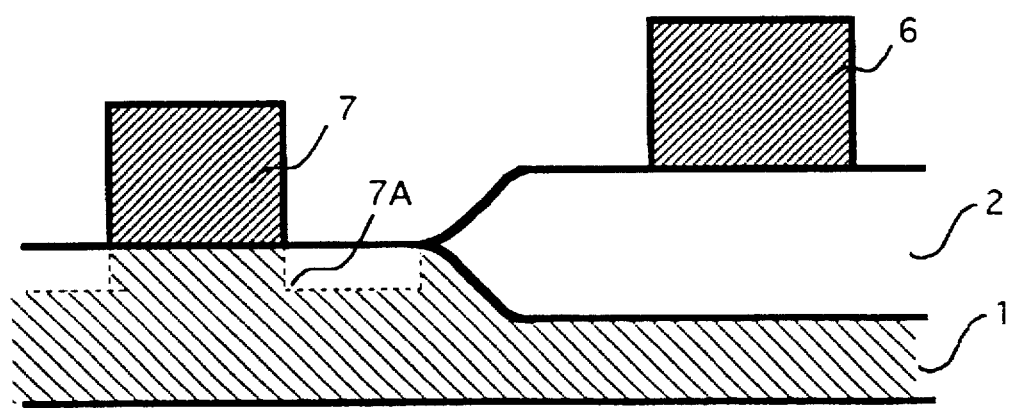
FIG. 2 shows a cross sectional view of a structure of the semiconductor device according to a second embodiment of the present invention.

The second embodiment of this invention is explained with reference to FIG. 2. FIG. 2 shows a cross sectional structure of the semiconductor device used for the confirmation of the etching state through the process in which a polysilicon lead is formed as a gate electrode of the product LSI.

Referring to FIG. 2, the device includes a Si substrate 1 and a Si oxide layer 2. A polysilicon lead 6 is formed on Si oxide 2 by etching, under the same conditions as in the product LSI, of the polysilicon film (material for etching) deposited on semiconductor substrate 1 and on Si oxide layer 2 also under the same conditions as in the product LSI.

A polysilicon lead 7 is formed on Si substrate 1 by etching, under the same conditions as in the product LSI, of the polysilicon film (material for etching) also deposited under the same conditions as in the product LSI. Both polysilicon leads 6 and 7 are part of a polysilicon film left after etching.

The structure of the semiconductor device shown in FIG. 2 is constructed on a part of the area or near the area of the same wafer where the product LSI is manufactured, and is manufactured simultaneously with the product LSI. In the manufacturing process of the product LSI in this case, the field oxidation process (film thickness 3000 Å) by the LOCOS method is adapted. Thereafter, a gate oxidation film of 100 Å thick is formed, and further polysilicon leads (film thickness 2000 Å and lead width 1 µm) is formed thereon. The polysilicon is deposited by the CVD method and the polysilicon lead is formed by anisotropic etching with a slow Si etching rate. The anisotropic etching of Si oxide is done by reactive ion etching, preferably using $CF_4+O_2$ etc. as an etching gas.

The manufacturing process of the structure of the semiconductor device shown in FIG. 2 is explained below referring to the figure. First, Si oxide layer 2 is formed, concurrently with the field oxidation process of the product LSI, in an area of the Si substrate 1 other than the area where the product LSI is manufactured. Next, the gate oxide layer of 100 Å is formed on Si substrate 1 in the manufacturing process of the product LSI. Next, the gate oxide layer on Si substrate 1, where the structure of this semiconductor device is formed, is removed, while masking the area where the product LSI is formed by a photoresist. Next, the polysilicon layer is deposited on Si substrate 1 and Si oxide layer 2 concurrently with the depositing of the polysilicon for the product LSI. Next, polysilicon leads 6 and 7 having the same width (preferably 1 µm) are formed concurrently with lead patterning of the product LSI.

The method of confirming the etching state by an electron microscope is explained below with regard to the structure of the semiconductor device shown in FIG. 2. The surface area of polysilicon lead 6, formed on Si oxide layer 2 shown in FIG. 2 under the same etching conditions as in the product LSI, and the surface of the area of polysilicon lead 7, formed on the Si substrate 1 under the same etching conditions as in the product LSI, are scanned with the electron microscope after the contact hole of the product LSI is formed.

When removing the polysilicon layer deposited on Si substrate 1 and on Si oxide layer 2 by etching at the outsides of the masked polysilicon leads 6 and 7, the etching of the polysilicon itself advances at the same speed. However, when the etching reaches Si oxide layer 2 by leaving polysilicon lead 6, the etching hardly advances in Si oxide layer 2. On the other hand, on silicon substrate 1, when polysilicon lead 7 is formed and the etching reaches Si substrate 1, the etching advances further into Si substrate 1. Therefore, the thickness of polysilicon lead 7 grows as shown by the reference numeral 7A in FIG. 2.

Then, the amount of etching of polysilicon lead 6 and polysilicon lead 7 (i.e. the depth of the etching, assumed to be a' and b' respectively) is measured by scanning the surface of the area of the structure shown in FIG. 2 with an electron microscope. Then the amount a' and b' are compared. If a'<b', that is, if the amount of etching of silicon substrate 1 is larger than the amount of etching on silicon oxide layer 2, it can be determined that the etching for polysilicon lead 6 surely reached Si oxide layer 2. Accordingly, it is concluded that the polysilicon etching of the product LSI is surely reaching the gate oxide layer in the product LSI (i.e. over etching).

Further, if a'=b', that is, if the amount of etching on silicon substrate 1 is equal to the amount of etching on silicon oxide layer 2, then it is determined that the etching for polysilicon lead 6 just reached Si oxide layer 2 or that the etching has not yet reached Si oxide layer 2. Accordingly, it is concluded that the polysilicon etching just reached the gate oxide layer (i.e. just etching), or the polysilicon etching does not reach the gate oxide layer (i.e. under etching) in the product LSI.

Further, it is also possible to measure at this time the width of polysilicon lead 6 and consequently the width of the polysilicon lead of the product LSI by scanning with the electron microscope. Accordingly, the product LSI can be manufactured without using an extra wafer for confirming the state of the etching in the wafer process.

Third Embodiment

Figure 3:
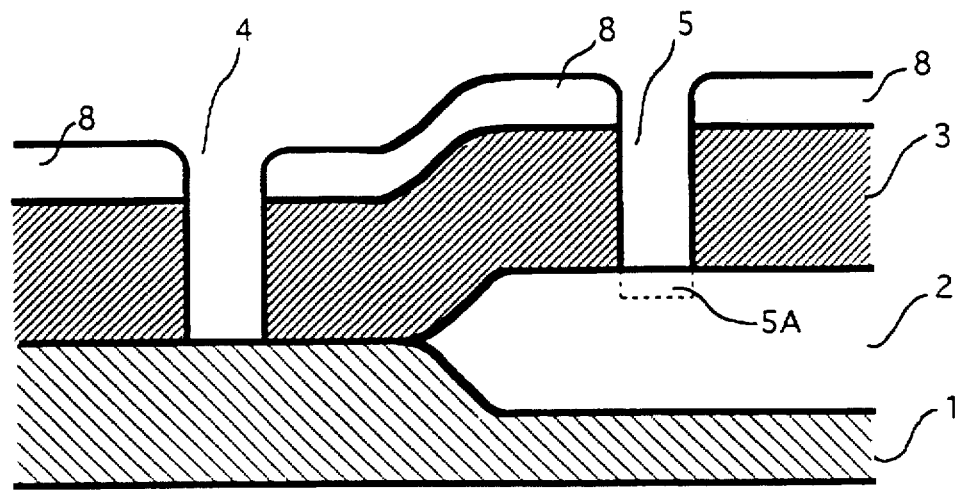
FIG. 3 illustrates a cross sectional view of a structure of a semiconductor device to explain a manufacturing process according to a third embodiment of the present invention.

The third embodiment of the present invention is explained with reference to FIG. 3. FIG. 3 shows a cross sectional structure of the semiconductor device for confirming the etching state in the process in which an opening is formed in a Si oxide layer on a Si substrate. Additional etching is then performed, when necessary, in the manufacture of the product LSI.

Referring to FIG. 3, in manufacturing the device, a Si oxide layer 2 is formed on a Si substrate 1. Another Si oxide layer (the etched material) 3 is deposited on semiconductor substrate 1 and Si oxide layer 2 under the same conditions as in the product LSI. A hole 4 is formed in Si oxide layer 3 on Si substrate 1 under the same etching conditions as in the product LSI, and a hole 5 is formed in Si oxide layer 3 on Si oxide layer 2 under the same etching conditions as in the product LSI. Then, a photoresist 8 is disposed for opening holes 4 and 5 and a contact hole in the product LSI.

The structure of the semiconductor device shown in FIG. 3 is constructed on a part of the area or near the area of the same wafer where the product LSI is manufactured, and is manufactured simultaneously with the product LSI. In manufacturing the product LSI in this case, the field oxidation process (film thickness 3000 Å) by the LOCOS method is preferably used. Further, the Si oxide layer of 3000 Å thick is deposited as an interlayer insulator by CVD method, and thereafter, a contact hole, preferably of 1 µm in diameter, is formed in the interlayer insulating film on the Si substrate by anisotropic etching of Si oxide. At this time, the anisotropic etching of Si oxide is performed, preferably using $CF_4+H_2$ or $CHF_3+O_2$ etc. as an etching gas, by reactive ion etching with a slow Si etching rate.

The manufacturing method of the structure of this semiconductor device shown in FIG. 3 is explained below referring to the figure. First, Si oxide layer 2 is formed, concurrently with the field oxidation process of the product LSI, on Si substrate 1 in an area of the substrate other than the area where the product LSI is manufactured. Next, Si oxide layer 3 is deposited on Si substrate 1 and Si oxide layer 2, concurrently with the depositing of the interlayer insulating film of the product LSI. Next, a photoresist 8 is disposed on Si oxide layer 3 on Si substrate 1 and on Si oxide layer 2, concurrently with the spread of a photoresist on the interlayer insulating film of the product LSI. Next, hole 4 and hole 5 are formed on photoresist 8 concurrently with the formation of the photoresist hole of the product LSI and under the same conditions as in the product LSI. Next, hole 4 is formed on Si oxide layer 3 on Si substrate 1 concurrently with the formation of the contact hole of the product LSI, by etching under the same conditions as in the product LSI. At the same time, hole 5 is formed on Si oxide layer 3 on Si oxide layer 2 by etching under the same conditions as in the product LSI. These holes 4 and 5 are formed with the same open caliber as the contact hole of the product LSI, preferably 1 μm in diameter.

The method of confirming the etching state using an electron microscope is explained below with regard to the structure of the semiconductor device shown in FIG. 3. The surface areas of hole 4 and hole are scanned with the electron microscope after the contact hole of the product LSI is formed.

In FIG. 3, when hole 4 and hole 5 are formed concurrently by etching Si oxide layer 3, the etching of Si oxide layer 3 advances at the same speed in each hole. When the etching reaches the depth of Si oxide layer 3, the etching hardly advances in hole 4 because the lower layer is Si substrate 1. On the other hand, the etching advances into Si oxide layer 2 continuously at a similar speed in hole 5, because the lower layer is Si oxide layer 2, and the etching reaches a depth as indicated by hole 5A shown in FIG. 3.

The amount of etching of hole 4 and hole 5 (i.e. the depth of the etching, assumed to be 'a' and 'b' respectively) is then measured by scanning the surface of the area of the structure shown in FIG. 3 with an electron microscope. Then the amounts 'a' and 'b' are compared. If 'a'<'b', that is, if the amount of etching of hole 5 is larger than the amount of etching of hole 4, then the etching penetrates through Si oxide 3 in hole 5. Therefore, it can be determined that the etching surely reached Si substrate 1 also in hole 4. Accordingly, it is judged that the contact hole is surely reaching the Si substrate in the product LSI (i.e. over etching).

Further, if 'a'='b', that is, if the amount of etching of hole 4 is equal to the amount of etching of hole 5, then the state is that hole 5 just reached Si oxide layer 2 or that hole 5 has not yet reached Si oxide layer 2. Therefore, it can be determined that the state is the same in hole 4 also. Accordingly, it is concluded that, in the product LSI, the contact hole just reached the Si substrate (i.e. just etching) or the contact hole does not reach the Si substrate (i.e. under etching).

Therefore, when the state is determined to be just etching or under etching, the etching is continued until the state is judged to have reached over etching by further etching the contact hole of the product LSI repeatedly with the photoresist remaining.

Therefore, in the present manufacturing method, by confirming the etching state in the same way as in the first embodiment, an additional etching can be done repeatedly with photoresist 8 still in place, until the contact hole in the product LSI surely reaches the Si substrate (i.e. over etching). Thus, wafers with insufficient etching can be decreased.

Fourth Embodiment

Figure 4:
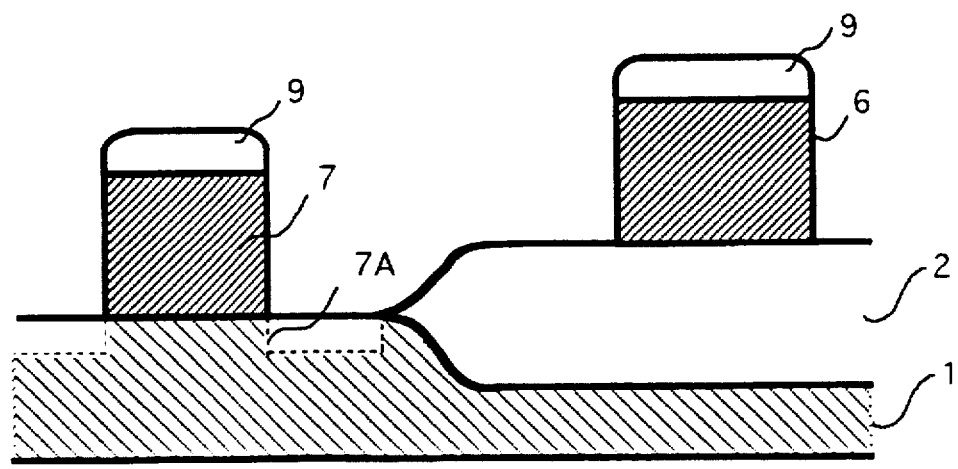
FIG. 4 illustrates a cross sectional view of a structure of a semiconductor device to explain a manufacturing process according to a fourth embodiment of the present invention.

The fourth embodiment of this invention is explained below with reference to FIG. 4. FIG. 4 shows a cross sectional structure of the semiconductor device used for confirmation of the etching state through a process in which a polysilicon lead is formed as a gate electrode in the product LSI.

Referring to FIG. 4, in the process of manufacturing a semiconductor device, a Si oxide layer 2 is formed on a Si substrate 1. A polysilicon lead 6 is formed by etching, under the same conditions as in the product LSI, from a polysilicon film (the material for etching) deposited on Si oxide layer 2. Another polysilicon lead 7 is also formed by etching, under the same conditions as in the product LSI, from the polysilicon film (the material for etching) deposited on Si substrate 1. Both polysilicon leads 6 and 7 are parts left after etching. Then, a photoresist is disposed for patterning polysilicon leads 6 and 7.

The structure of the semiconductor device shown in FIG. 4 is constructed on a part of the area or near the area of the same wafer where the product LSI is manufactured, and is manufactured simultaneously with the product LSI. In the manufacturing process of the product LSI in this case, the field oxidation process (having preferred film thickness of 3000 Å) by the LOCOS method is preferably used, and the polysilicon lead (having preferred film thickness 2000 Å and preferred lead width of 1 μm) is formed on the gate oxidation film 100 μ given. The polysilicon layer is deposited by the CVD method and polysilicon leads 6 and 7 are formed by anisotropic etching using a slow Si oxide etching rate. The anisotropic etching of the Si oxide layer is performed by reactive ion etching, preferably using $CF_4+O_2$ etc. as an etching gas.

The manufacturing method of the structure of the semiconductor device shown in FIG. 4 is explained below referring to the Figure. First, Si oxide layer 2 is formed, concurrently with the field oxidation process of the product LSI, on Si substrate 1 in an area of the substrate other than the area where the product LSI is manufactured. Next, the gate oxide layer (100 Å) is formed on Si substrate 1 in the manufacturing process of the product LSI. Next, the gate oxide layer on Si substrate 1 is removed in the area where the structure of the semiconductor device is formed, by masking the area with a photoresist. Next, the polysilicon layer is deposited on Si substrate 1 and Si oxide layer 2, concurrently with the deposition of the polysilicon in the product LSI. Next, the photoresist is spread on the polysilicon layer concurrently with the spread of the photoresist on the polysilicon layer of the product LSI. Next, polysilicon leads 6 and 7 having the same widths (preferably 1 μm) are formed concurrently with the lead patterning of the product LSI.

The method of confirming the etching state by using an electron microscope is explained below with regard to the structure of the semiconductor device shown in FIG. 4. The surface area of polysilicon lead 6, formed on Si oxide layer 2, and the surface of the area of polysilicon lead 7, formed on Si substrate 1, are scanned with an electron microscope after the gate electrode of the product LSI is formed.

When the polysilicon layer deposited on Si substrate 1 and Si oxide layer 2 is removed by etching with masking on polysilicon leads 6 and 7, the etching of the polysilicon itself advances at the same speed. However, when the etching reaches Si oxide layer 2 by leaving polysilicon lead 6, the etching hardly advances into Si oxide layer 2. On the other hand, on silicon substrate 1, when polysilicon lead 7 is formed and the etching reaches Si substrate 1, the etching advances further into Si substrate 1. Thus, the thickness of polysilicon lead 7 is extended as shown by reference numeral 7A in FIG. 4.

The amount of etching of polysilicon lead 6 and polysilicon lead 7 (i.e. the depth of the etching, assumed to be a' and b' respectively) is then measured by scanning the surface of the area of the structure shown in the Figure with an electron microscope. Then the amount a' and b' are compared. If a'<b', that is, if the amount of etching on silicon substrate 1 is larger than the amount of etching on silicon oxide layer 2, it can be determined that the etching for polysilicon lead 6 surely reached Si oxide layer 2. Accordingly, it is concluded that the polysilicon etching of the product LSI is surely reaching the gate oxide layer in the product LSI (i.e. over etching).

Further, if a'=b', that is, if the amount of etching on silicon substrate 1 is equal to the amount of etching on silicon oxide layer 2, then it is determined that the etching for polysilicon lead 6 just reached Si oxide layer 2 or that the etching has not yet reached Si oxide layer 2. Accordingly, it is concluded that the polysilicon etching just reached the gate oxide layer (i.e. just etching) or the polysilicon etching has not yet reached the gate oxide layer (i.e. under etching) in the product LSI.

Therefore, when the state is just etching or under etching, etching of the polysilicon of the product LSI is further continued with photoresist 9 remaining until the state is determined to have reached over etching.

Therefore, in the present manufacturing method, by confirming the etching state in the same way as in the second embodiment, an additional etching can be done repeatedly with photoresist mask 9 still in place until the polysilicon etching of the product LSI is surely reaching the gate oxide layer (i. e. over etching). Thus, wafers with insufficient etching can be decreased.

As explained above, in each embodiment of the present invention, in order to confirm the completion of etching of a material in the manufacturing process of a semiconductor device, the same material for etching is formed as a reference point concurrently with the manufacturing of the semiconductor products, on a material having different etching characteristics, and in the same way as the product manufacturing process. At the same time, the same material for etching is formed as a monitor point on the material having the same etching characteristics. Thereafter, the amount of etching at both points are measured by an electron microscope, and the completion of etching is confirmed by comparing the amount of etching on each of the reference point and the monitor point.

As explained above, according to the present invention, the etching state of a product can be confirmed in the manufacturing process without using extra wafers by sampling in the manufacturing process. Further, additional etching can be performed in the manufacturing process when necessary.

This application is based on Japanese Patent Application 8-73568, filed with the Japanese Patent Office on Mar. 28, 1996, the entire contents of which are hereby incorporated by reference.

Obviously many modifications and variations of the present invention are possible in the light of the above teachings. It is therefore to be understood that within the scope of the appended claims the invention may by practiced otherwise than as specifically described.

What is claimed as new and desired to be secured by Letters Patent of the United States is:

1. A semiconductor device comprising:
    a test layer and a target layer, wherein said test layer is formed on a wafer on a first area of the wafer that is different from a second area of the wafer on which the target layer is formed, wherein said target layer is a layer in a semiconductor product and said first area does not provide a semiconductor function in the semiconductor device;
    wherein said test layer is formed on a first layer, and on a second layer interposed between a portion of said test layer and a portion of said first layer and in contact with said test layer and said test layer and said first layer are in contact with each other where the second layer is not interposed, wherein the following is true:
    said first layer has etching characteristics different from said etching characteristics of said target layer and said second layer has etching characteristics that are the same as said etching characteristics of said target layer;
    and wherein said test layer is formed concurrently with said target layer and under identical formation conditions;
    wherein said test layer has holes formed by etching respectively through said test layer to said first and second layers, concurrently with formation of a hole in said target layer and under identical hole formation conditions as used in hole formation in said target layer of said semiconductor product:
    wherein an etched state of said target layer of said semiconductor product is confirmed by comparing etched states of said holes in said test layer on said first and second layers.

2. The semiconductor device as claimed in claim 1, wherein said target layer is a silicon oxide layer, said test layer and said second layer are each a silicon oxide layer, and said first layer is a semiconductor substrate layer.

3. The semiconductor device according to claim 2, wherein the semiconductor substrate layer is a silicon substrate layer.

4. The semiconductor device according to claim 3, wherein the semiconductor product is a LSI.

5. The semiconductor device according to claim 2, wherein the semiconductor product is a LSI.

6. The semiconductor device according to claim 1, wherein holes formed by etching through the test layer are etched more deeply where said test layer is on the second layer than where it is on the first layer.

7. The semiconductor device as claimed in claim 1, wherein said hole formed in said target layer is a contact hole in said semiconductor product.

8. The semiconductor device as set forth in claim 1 wherein said holes formed in said target layer and said test layer each have a diameter of 1 μm.

9. A semiconductor device comprising:
    a test layer and a target layer, wherein said test layer is formed on a wafer on a first area of the wafer that is different from a second area of the wafer on which the target layer is formed, wherein said target layer is a layer in a semiconductor product and said first area does not provide a semiconductor function in the semiconductor device:
    wherein said test layer is formed on a first layer, and on a second layer interposed between a portion of said test layer and a portion of said first layer and in contact with said test layer and said test layer and said first layer are in contact with each other where the second layer is not interposed, wherein the following is true:

said first layer has etching characteristics that are the same as etching characteristics of said target layer and said second layer has etching characteristics different from said etching characteristics of said target layer;

and wherein said test layer is formed concurrently with said target layer and under identical formation conditions;

wherein said etching of each of said test layer and said target layer is performed to a sufficient extent to provide a plurality of remaining portions of said test layer and one or more remaining portions of said target layer, wherein at least one of said plurality of remaining portions of said test layer is located over said first layer and at least one of said remaining portions of said test layer is located over said second layer wherein an etching state of said one or more remaining portions of said target layer of said semiconductor product is confirmed by comparing etched states of said plurality of portions in said test layer over each of said first and second layers.

10. The semiconductor device according to claim 9, wherein the etching through the test layer is deeper where said test layer is on the first layer than where it is on the second layer.

11. The semiconductor device according to claim 9, wherein the semiconductor product is a LSI.

12. The semiconductor device as claimed in claim 9, wherein each of said target layer and said test layer are a polysilicon layer, said first layer is a semiconductor substrate layer, and said second layer is a silicon oxide layer.

13. The semiconductor device according to claim 12, wherein the semiconductor substrate layer is a silicon substrate layer.

14. The semiconductor device according to claim 13, wherein the semiconductor product is a LSI.

15. The semiconductor device as claimed in claim 9, wherein said one or more remaining portions of said target layer of said semiconductor product form a gate electrode.

* * * * *